United States Patent [19]
Saikaishi et al.

[11] 3,982,198
[45] Sept. 21, 1976

[54] OSCILLATORS

[75] Inventors: Noboru Saikaishi; Yukio Numata; Tetsuo Takahashi; Morio Kumagai; Michinori Naito, all of Tokyo, Japan

[73] Assignee: Trio Electronics Incorporated, Tokyo, Japan

[22] Filed: Sept. 25, 1974

[21] Appl. No.: 509,274

[30] Foreign Application Priority Data
Oct. 23, 1973 Japan............................ 48-119187

[52] U.S. Cl................................. 331/27; 325/346; 325/349; 325/421; 331/8; 331/18
[51] Int. Cl.²........................................... H04B 1/16
[58] Field of Search.............. 331/18, 25, 8, 27, 26, 331/20; 328/134; 325/346, 349, 416–423

[56] References Cited
UNITED STATES PATENTS

| | | | |
|---|---|---|---|
| 2,521,058 | 9/1950 | Goldberg | 328/155 |
| 2,617,040 | 11/1952 | Bailey | 331/28 |
| 3,080,533 | 3/1963 | Edwards | 331/8 |
| 3,130,376 | 4/1964 | Ross | 331/18 |
| 3,204,197 | 8/1965 | Marzan | 331/18 |
| 3,249,886 | 5/1966 | Anderson et al. | 331/18 |
| 3,484,706 | 12/1969 | Saalborn | 331/27 |
| 3,821,470 | 6/1974 | Merrell | 331/27 |
| 3,821,658 | 6/1974 | Hoeft | 331/27 |

OTHER PUBLICATIONS
IEEE Transactions on Broadcast & Television Receivers, Nov. 1970, pp. 281–288.

Primary Examiner—John Kominski
Attorney, Agent, or Firm—Charles E. Pfund

[57] ABSTRACT

An oscillator suitable for use as a local oscillator of high frequency apparatus comprises a voltage controlled oscillator, a reference oscillator, a phase detector for detecting the phase difference between the oscillation frequencies of the voltage controlled oscillator and the reference oscillator, means for filtering the output of the phase detector to produce a DC voltage and a phase synchronizing loop for feeding back the DC output of the low-pass filter means to the voltage controlled oscillator. Depending upon whether the oscillation frequency of the reference oscillator is maintained at a duty cycle of 50% or at a value other than 50%, the oscillation frequency of the voltage controlled oscillator is synchronized with an odd multiple or an integer multiple of the oscillation frequency of the reference oscillator when the oscillation frequency of the voltage controlled oscillator is varied forcibly.

2 Claims, 5 Drawing Figures

OSCILLATORS

BACKGROUND OF THE INVENTION

This invention relates to a high frequency oscillator utilizing a phase synchronizing or locking loop and is useful as a local oscillator of a FM receiver, television receiver, communicating system or other superheterodyne system.

In the prior art local oscillator utilizing a variable capacitor, for example, the oscillation frequency varies with temperature or moisture variation or with the elapse of time. Although a receiver provided with an automatic frequency control circuit (AFC) has been proposed to obviate this difficulty, there is a difficulty that the reception of the signals from broadcasting stations with small antenna input level are interfered with the signals from neighboring broadcasting stations with large antenna input level. For this reason, as an oscillator having a sufficient frequency stability a frequency synthesizing type oscillator of the phase locking type and utilizing a programmable frequency divider has recently been used. FIG. 1 shows a block diagram of one example of such an oscillator in which the oscillation frequency of a voltage controlled oscillator 1 is divided by a programmable frequency divider 2 and the phase of the output of the frequency divider 2 is compared by means of a phase detector 3 with the phase of the oscillation frequency of a reference oscillator 7 operating at substantially the same frequency. The detector output corresponding to the phase difference is filtered by a low pass filter 4. The output of the filter 4 is fed back to the oscillator 1 for stabilizing the oscillation frequency thereof. When such an oscillator is used as a local oscillator of a receiver it is possible to vary the receiving frequency by varying the ratio of the frequency division of the programmable frequency divider 2 by manipulating a frequency division ratio setting circuit 6 whereby it is possible to obtain a receiver of excellent characteristic. However, such an oscillator cannot be used extensively because the programmable frequency divider and the frequency division ratio setting circuit are extremely complicated and expensive.

SUMMARY OF THE INVENTION

It is an object of this invention to provide an improved oscillator which can obviate the difficulties described above and can exhibit similar stability of the oscillation frequency with simpler construction than the prior art frequency synthesizing type oscillator utilizing a programmable frequency divider.

Another object of this invention is to provide an improved oscillator which is not required to use any programmable frequency divider for varying the received frequency.

Still another object of this invention is to provide an improved oscillator which is suitable for use as a local oscillator in a FM receiver, television receiver or other high frequency apparatus utilizing a super heterodyne type demodulator.

According to this invention there is provided an oscillator comprising a voltage controlled oscillator, means for forcibly varying the oscillation frequency of the voltage controlled oscillator, a reference oscillator having an oscillation frequency maintained at a duty ratio of 50%, a phase detector for detecting the phase difference between the oscillation frequency of the voltage controlled oscillator and that of the reference oscillator, means for filtering the output of the phase detector for producing a DC voltage, and a phase synchronizing loop for feeding back the DC voltage to the voltage controlled oscillator, whereby when the oscillation frequency of the voltage controlled oscillator is varied, the oscillation frequency thereof is synchronized with only an odd multiple of the oscillation frequency of the reference oscillator.

According to another aspect of this invention there is provided an oscillator of the same general construction as just described but in which the oscillation frequency of the reference oscillator is maintained at a duty cycle of other than 50% whereby the oscillation frequency of the voltage controlled oscillator is synchronized with an integer multiple of the oscillation frequency of the reference oscillator.

BRIEF DESCRIPTION OF THE INVENTION

Further objects and advantages of the invention can be more fully understood from the following detailed description taken in conjunction with the accompanying drawings in which.

DESCRIPTION OF THE PREFERRED EMBODIMENTS

Figure 1:
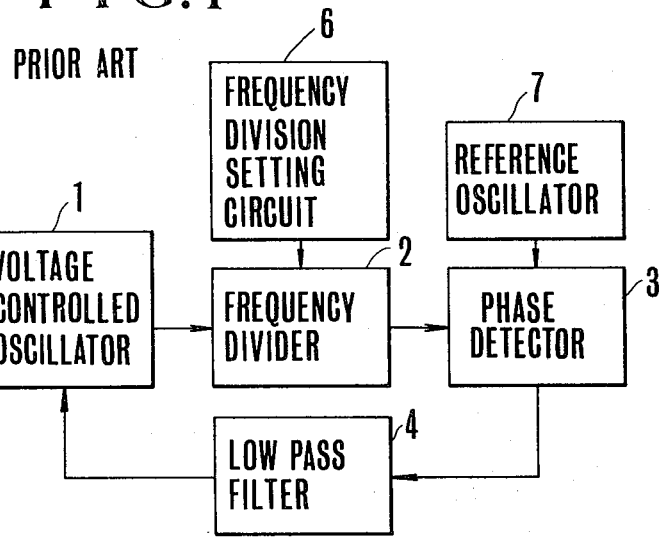
FIG. 1 is a block diagram showing one example of a prior art frequency synthesizing type oscillator utilizing a programmable frequency divider.
Figure 2:
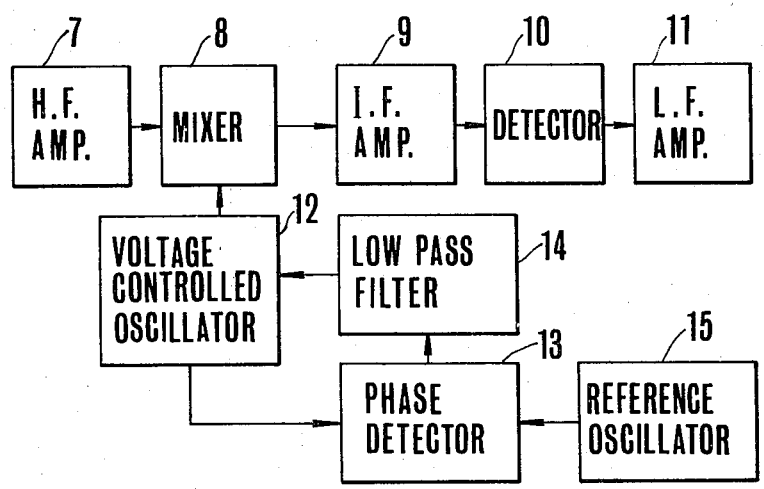
FIG. 2 is a block diagram showing one embodiment of the novel oscillator embodying this invention.

A preferred embodiment of the novel oscillator shown in FIG. 2 comprises a voltage controlled oscillator 12, a phase detector 13, a low pass filter 14 and a reference oscillator 15 which constitute a phase synchronizing or locking loop.

According to this invention, the voltage controlled oscillator 12 is used as a local oscillator and its oscillation frequency is mixed with the frequency of the signal received from a high frequency amplifier 7 by means of a mixer 8 to produce an intermediate frequency signal which is amplified by an intermediate frequency amplifier 9 and then detected by a detector 10. The output from the detector 10 is amplified by a low frequency amplifier 11 and then supplied to a utilization circuit such as a loudspeaker, not shown.

As shown, the oscillation frequency $f_o$ of the voltage controlled oscillator 12 is applied to one input of the phase detector 13. The oscillation frequency $f_r$ of the reference oscillator 15 is maintained at a duty ratio of 50% and is applied to the other input of the phase detector 13. The phase detector 13 operates to detect the phase difference between the oscillation frequency $f_o$ of the voltage controlled oscillator 12 and the oscillation frequency $f_r$ of the reference oscillator 15 and the detector output is filtered by a low pass filter 14, the DC output thereof being fed back to the voltage controlled oscillator 12 for stabilizing the oscillation frequency thereof. Such an oscillator is synchronized to operate stably only when the oscillation frequency of the voltage controlled oscillator 12 is set to be an odd multiple of the frequency $f_r$ of the reference oscillator operating at a duty ratio of 50%.

Figure 3:
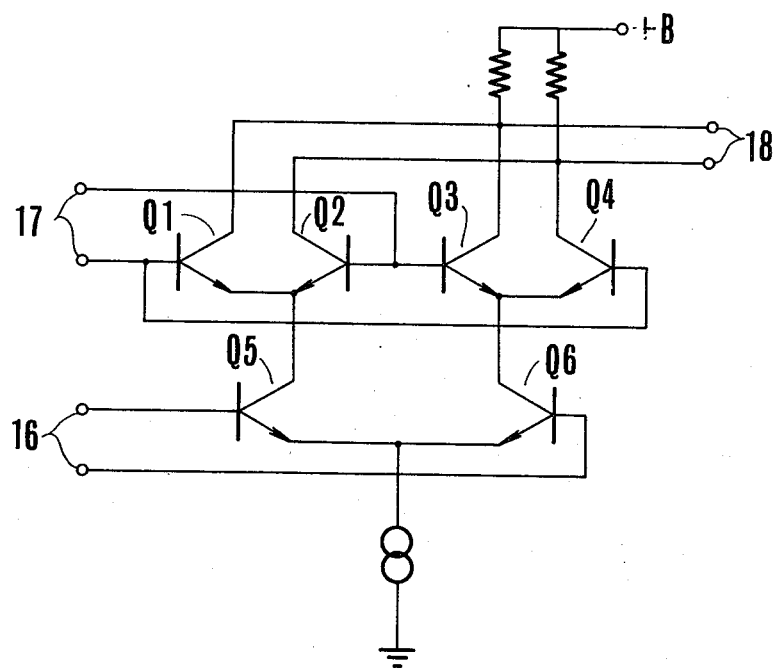
FIG. 3 is a connection diagram of a phase detector utilized in the novel oscillator of this invention.
Figure 4:
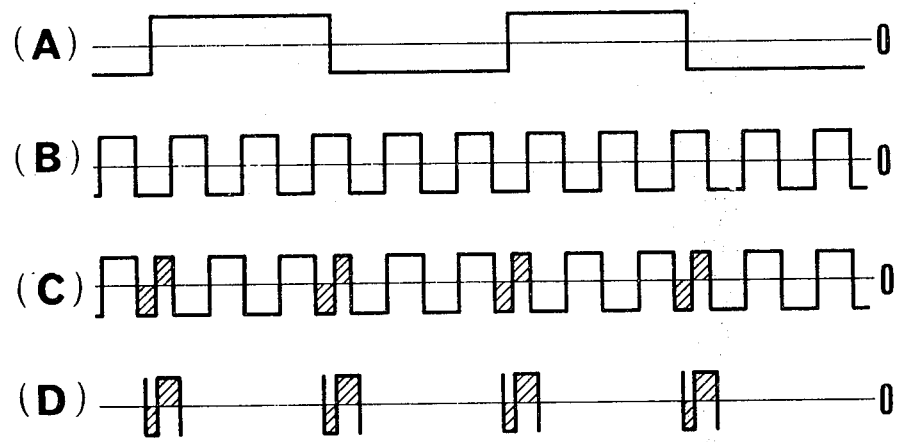
FIGS. 4 and 5 show signal waveforms at various portions of the circuit.

FIG. 3 shows a connection diagram of the phase detector 13 shown in the block diagram of FIG. 2, and FIG. 4 shows signal waveforms at various portions thereof. The phase detector shown in FIG. 3 comprises two pairs of differential amplifiers including transistors $Q_1$, $Q_2$ and $Q_3$, $Q_4$ having commonly connected collector electrodes and base electrodes and another differential amplifier including transistors $Q_5$ and $Q_6$. The collector electrodes of transistors $Q_5$ and $Q_6$ are respectively connected to the common junctures between emitter electrodes of transistors $Q_1$ and $Q_2$ and between the emitter electrodes of transistors $Q_3$ and $Q_4$. The differential input terminals 16 of transistors $Q_5$ and $Q_6$ are used as a first input while differential input terminals 17 commonly connected to the base electrodes of transistors $Q_2$, $Q_3$ and $Q_1$, $Q_4$ are used as a second input. The differential output terminals 18 commonly connected to the collector electrodes of transistors $Q_1$, $Q_3$ and $Q_2$, $Q_4$ are used as a detector output.

When a signal having the oscillation frequency of the reference oscillator 15 and shown by FIG. 4A is impressed upon the first input terminals 16, a detector output having a symmetrical waveform as shown in FIG. 4C appears across the output terminals 18 when oscillation frequency of the signal of the voltage controlled oscillator 12 impressed across the second input terminals 17 is an odd multiple of that of the signal A and when these two signals have a phase relationship as shown by FIG. 4A and FIG. 4B. Accordingly, when the detector output is filtered by the low pass filter 14, the DC component of the output from the low pass filter 14 will be zero. FIG. 4B shows a signal having a frequency of five times of that of the signal shown in FIG. 4A. Accordingly, under such conditions, the oscillation frequency $f_o$ of the voltage controlled oscillator 12 is synchronized with the oscillation frequency $f_r$ of the reference oscillator so that the voltage controlled oscillator 12 operates stably. If the phase of the oscillation frequency $f_o$ of the voltage controlled oscillator 12 lags or advances than that of the oscillation frequency $f_r$ of the reference oscillator 15, the waveform of the detector output appearing across output terminals 18 would be asymmetric near the build-up and build-down portions of the signal wave (shown in FIG. 4A) of the oscillation output of the reference oscillator 15. FIG. 4D shows the waveform at the build-up and build-down portions of the waveform shown in FIG. 4A and appearing across the output terminals 18 when the phase of the signal having the oscillation frequency $f_o$ of the voltage controlled oscillator 12 lags with respect to that of the signal having the oscillation frequency $f_r$ of the reference oscillator 15. When the detector output shown in FIG. 4D is filtered by a low pass filter 14 or a suitable rectifier, a positive DC voltage is obtained which when applied to the voltage controlled oscillator 12 functions to bring back the oscillation frequency of the voltage controlled oscillator to the original condition of synchronism. On the other hand, when the phase of the oscillation frequency $f_o$ leads, a negative DC voltage is produced by the low pass filter and the negative voltage is used to restore the synchronism of the voltage controlled oscillator 12.

Under such synchronous condition the following relation holds $$f_o = (2K + 1)f_r \qquad (1)$$

where $K$ represents a positive integer. Accordingly, when the oscillation frequency of the voltage controlled oscillator 12 is varied by means of a variable capacitor or the like it will become synchronous at a frequency of an odd multiple of the oscillation frequency $f_r$ of the reference oscillator 15, thus varying the oscillation frequency of the voltage controlled oscillator 12. For example, where the novel oscillator is used as a local oscillator of FM receiver, and where the reference oscillator 15 operates at an oscillation frequency of 50 kHz, the oscillation frequency of the voltage controlled oscillator varies at an interval of an odd multiple of 50kHz. Under these conditions, reception of the wave from an FM broadcasting station is possible by setting an intermediate frequency of 10.75 MHz.

Figure 5:
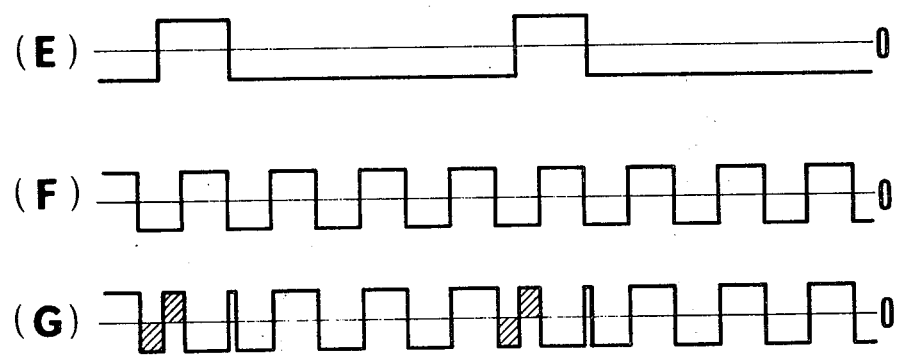

When the oscillation frequency of the reference oscillator 15 whose duty ratio has been set to a value other than 50% as shown in FIG. 5E is impressed across the first input terminals 16 of the phase detector 13 shown in FIG. 3, the oscillation of the voltage controlled oscillator 12 becomes synchronous when its fundamental oscillation frequency applied across the second input terminals 17 becomes an odd or even multiple, that is an integer multiple of the oscillation frequency of the reference oscillator 15. FIG. 5F shows the waveform of the voltage controlled oscillator 12 having an oscillation frequency equal to four times of the oscillation frequency of the reference oscillator 15 in which case an output having a waveform as shown in FIG. 5G is impressed across the output terminals 18 from the phase detector 13. In this case, too, depending upon the manner of setting the duty cycle of the oscillation frequency of the reference oscillator 15, asymmetrical portions as shown in FIG. 5G are included in the output wave from the phase detector 13 at portions corresponding to the build-down portions of the reference oscillation frquency, even under a synchronous condition. These asymmetrical portions produce a definite DC control voltage when they are filtered by the low pass filter 14. However, this control voltage causes only a slight variation of the phase of the oscillation output of the voltage controlled oscillator 12 but the oscillation thereof is maintained stably at the desired frequency. Said variation in the phase decreases to a negligible value as the oscillation frequency of the voltage controlled oscillator becomes higher than that of the reference oscillator. Accordingly, when the novel oscillator is used as a local oscillator of an FM receiver and when the oscillation frequency of the reference oscillator is set to 100 kHz, the frequency of the local oscillator varies at an interval of 100 kHz, thus enabling to receive FM waves.

Thus, the invention can provide an oscillator of simple construction and having an excellent frequency stability without using a programmable frequency divider. Further, in the prior art synthesizing type oscillator wherein the received frequency is varied by means of a programmable frequency divider, the display is made digitally, so that the display and tuning should be made by circuits different from those used in usual receivers. However, in the receiver utilizing the novel oscillator of this invention, the display and tuning can be made by the same circuits as those used in usual receivers. According to this invention, it is also possible to use a digital display device.

It should be understood that the invention is not limited to a specific embodiment shown and described and that many changes and modifications may be made without departing from the scope of the invention as defined in the appended claims.

What is claimed is:

1. An oscillator for a broadcasting receiver comprising a voltage controlled oscillator the output frequency of which is the local oscillation frequency output for said broadcast receiver, means for forcibly varying the oscillation frequency of said voltage controlled oscillator, a reference oscillator having an oscillation frequency equal to to half the allocated frequency spacing between individual broadcast stations in the broadcast band, means for setting said reference oscillator to oscillate at a duty ratio of 50%, a phase detector for detecting the phase difference between the oscillation frequency of said voltage controlled oscillator and that of said reference oscillator, means for filtering the output of said phase detector for producing a DC voltage, and a phase synchronizing loop for feeding back said DC voltage to said voltage controlled oscillator, whereby when the oscillation frequency of said voltage controlled oscillator is varied, said local oscillation frequency output is varied stepwise in accordance with said allocated frequency spacing by synchronizing with only an odd multiple of the oscillation frequency of said reference oscillator.

2. An oscillator for a broadcasting receiver comprising a voltage controlled oscillator the output frequency of which is the local oscillation frequency output for said broadcast receiver, means for forcibly varying the oscillation frequency of said voltage controlled oscillator, a reference oscillator having an oscillation frequency equal to the allocated frequency spacing between individual broadcast stations in the broadcast band, means for setting said reference oscillator to oscillate at a duty ratio of 50%, a phase detector for detecting the phase difference between the oscillation frequency of said voltage controlled oscillator and that of said reference oscillator, means for filtering the output of said phase detector for producing a DC voltage, and a phase synchronizing loop for feeding back said DC voltage to said voltage controlled oscillator, whereby when the oscillation frequency of said voltage controlled oscillator is varied, said local oscillation frequency output is varied stepwise in accordance with said allocated frequency spacing by synchronizing with only an integer multiple of the oscillation frequency of said reference oscillator.

* * * * *

UNITED STATES PATENT AND TRADEMARK OFFICE
CERTIFICATE OF CORRECTION

PATENT NO. : 3,982,198
DATED : September 21, 1976
INVENTOR(S) : Noboru Saikaishi; Yukio Numata; Tetsuo Takahashi, Morio Kumagai; and Michinori Naito It is certified that error appears in the above-identified patent and that said Letters Patent are hereby corrected as shown below:

Column 6, line 11, after "ratio" insert --other than--

Signed and Sealed this twelfth Day of July 1977

[SEAL]

Attest:

RUTH C. MASON
*Attesting Officer*

C. MARSHALL DANN
*Commissioner of Patents and Trademarks*